United States Patent
Kishimoto et al.

(10) Patent No.: US 12,456,959 B2
(45) Date of Patent: Oct. 28, 2025

(54) PIEZOELECTRIC ELEMENT

(71) Applicant: Murata Manufacturing Co., Ltd., Nagaokakyo (JP)

(72) Inventors: Yutaka Kishimoto, Nagaokakyo (JP); Shinsuke Ikeuchi, Nagaokakyo (JP); Masayuki Suzuki, Nagaokakyo (JP); Fumiya Kurokawa, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 910 days.

(21) Appl. No.: 17/685,437

(22) Filed: Mar. 3, 2022

(65) Prior Publication Data
US 2022/0271728 A1    Aug. 25, 2022

Related U.S. Application Data

(63) Continuation of application No. PCT/JP2020/020537, filed on May 25, 2020.

(30) Foreign Application Priority Data

Sep. 12, 2019    (JP) .................................. 2019-166218

(51) Int. Cl.
*H03H 9/02*    (2006.01)
*H03H 3/02*    (2006.01)
(Continued)

(52) U.S. Cl.
CPC .......... *H03H 9/02133* (2013.01); *H03H 3/02* (2013.01); *H03H 9/02031* (2013.01);
(Continued)

(58) Field of Classification Search
CPC ........... H03H 9/02133; H03H 9/02031; H03H 9/02228; H03H 9/174; H03H 9/176
See application file for complete search history.

(56) References Cited

U.S. PATENT DOCUMENTS

2006/0001508 A1* 1/2006 Ohara ................ H03H 9/02133
                                                  333/191
2016/0028367 A1* 1/2016 Shealy ...................... H03H 3/02
                                                  438/51
(Continued)

FOREIGN PATENT DOCUMENTS

JP    2007-081645 A    3/2007
JP    2008-244725 A    10/2008
(Continued)

OTHER PUBLICATIONS

Official Communication issued in International Patent Application No. PCT/JP2020/020537, mailed on Jul. 28, 2020.

*Primary Examiner* — Bryan P Gordon

(74) *Attorney, Agent, or Firm* — Keating & Bennett, LLP

(57) ABSTRACT

A piezoelectric element includes a second electrode layer on a second surface of a single-crystal piezoelectric layer. A hole continuous with a through-hole is provided in the second electrode layer. The second electrode layer is made of Pt, Ti, Al, Cu, Au, Ag, Mg, or an alloy including at least one of the metals as a main ingredient. A third electrode layer is on one side of the second electrode layer opposite to the single-crystal piezoelectric layer. The third electrode layer includes at least a portion outside of an edge of the hole with a distance maintained relative to the edge of the hole when viewed in a direction perpendicular or substantially perpendicular to the second surface. The third electrode layer is made of Ni or an alloy including Ni as a main ingredient.

20 Claims, 8 Drawing Sheets

(51) Int. Cl.
  *H03H 9/13*  (2006.01)
  *H03H 9/17*  (2006.01)
(52) U.S. Cl.
  CPC .......... *H03H 9/02228* (2013.01); *H03H 9/13* (2013.01); *H03H 9/174* (2013.01); *H03H 9/176* (2013.01); *H03H 2003/023* (2013.01)

(56) References Cited

U.S. PATENT DOCUMENTS

2016/0065172 A1     3/2016  Shealy
2021/0399716 A1*   12/2021  Yu ........................ H03H 9/0514
2022/0271728 A1*    8/2022  Kishimoto ............. H03H 9/131

FOREIGN PATENT DOCUMENTS

| JP | 2009-005143 | A | 1/2009 |
| JP | 2010-164331 | A | 7/2010 |
| JP | 2011-044528 | A | 3/2011 |
| JP | 2011-086783 | A | 4/2011 |

* cited by examiner

PIEZOELECTRIC ELEMENT

CROSS REFERENCE TO RELATED APPLICATIONS

This application claims the benefit of priority to Japanese Patent Application No. 2019-166218 filed on Sep. 12, 2019 and is a Continuation application of PCT Application No. PCT/JP2020/020537 filed on May 25, 2020. The entire contents of each application are hereby incorporated herein by reference.

BACKGROUND OF THE INVENTION

1. Field of the Invention

The present invention relates to a piezoelectric element.

2. Description of the Related Art

Japanese Unexamined Patent Application Publication No. 2008-244725 discloses a configuration of a piezoelectric element. The piezoelectric element disclosed in Japanese Unexamined Patent Application Publication No. 2008-244725 is a piezoelectric thin film device including one or more piezoelectric thin film resonators. The piezoelectric thin film device includes a piezoelectric thin film, electrodes, and a support. The electrodes are formed on both principal surfaces of the piezoelectric thin film in a one-to-one relationship and are opposed to each other in an opposing region with the piezoelectric thin film interposed therebetween. One lower electrode is formed on a lower surface of the piezoelectric thin film, and an upper electrode is formed on an upper surface of the piezoelectric thin film. The support supports the piezoelectric thin film. A via hole penetrating between the lower surface and the upper surface of the piezoelectric thin film is formed through the piezoelectric thin film. In a method of manufacturing the piezoelectric element, the piezoelectric thin film is etched to form the via hole penetrating between the upper surface and the lower surface of the piezoelectric thin film, thus making the lower electrode exposed.

In the related-art piezoelectric element, when the through-hole is formed to penetrate from a first surface side to a second surface side of a single-crystal piezoelectric layer by etching, it may occur in some cases that the etching is not stopped and a through-hole in continuity with the above-described through-hole is formed in an electrode layer positioned on the second surface side. If the etching is not stopped even after the through-hole has been formed in the electrode layer, an unintended hole in continuity with the through-hole in the electrode layer may be further formed by the etching in a member that is positioned on one side of the electrode layer opposite to the single-crystal piezoelectric layer.

SUMMARY OF THE INVENTION

Preferred embodiments of the present invention provide piezoelectric elements in each of which, when a through-hole is to be formed in a single-crystal piezoelectric layer, a hole can be prevented from being formed in a member that is positioned on one side of the electrode layer opposite to a single-crystal piezoelectric layer.

A piezoelectric element according to a preferred embodiment of the present invention includes a single-crystal piezoelectric layer, a first electrode layer, a second electrode layer, and a third electrode layer. The single-crystal piezoelectric layer includes a first surface, a second surface, and a through-hole. The second surface is on an opposite side to the first surface. The through-hole penetrates from the first surface to the second surface. The first electrode layer is on a first surface side of the single-crystal piezoelectric layer. The second electrode layer is on a second surface side of the single-crystal piezoelectric layer. At least a portion of the second electrode layer is opposed to the first electrode layer with the single-crystal piezoelectric layer interposed therebetween. The second electrode layer includes a hole continuous with the through-hole. The second electrode layer is made of Pt, Ti, Al, Cu, Au, Ag, Mg, or an alloy including at least one of Pt, Ti, Al, Cu, Au, Ag, or Mg as a main ingredient. The third electrode layer is on a side of the second electrode layer opposite to the single-crystal piezoelectric layer. The third electrode layer includes at least a portion that is outside of an edge of the hole with a distance maintained relative to the edge of the hole when viewed in a direction perpendicular or substantially perpendicular to the second surface. The third electrode layer is made of Ni or an alloy including Ni as a main ingredient.

A piezoelectric element according to a preferred embodiment of the present invention includes a single-crystal piezoelectric layer, a first electrode layer, a second electrode layer, and a third electrode layer. The single-crystal piezoelectric layer includes a first surface, a second surface, and a through-hole. The second surface is on an opposite side to the first surface. The through-hole penetrates from the first surface to the second surface. The first electrode layer is on a first surface side of the single-crystal piezoelectric layer. The second electrode layer is on a second surface side of the single-crystal piezoelectric layer. At least a portion of the second electrode layer is opposed to the first electrode layer with the single-crystal piezoelectric layer interposed therebetween. The second electrode layer includes a hole continuous with the through-hole. The third electrode layer is on a side of the second electrode layer opposite to the single-crystal piezoelectric layer. The third electrode layer includes at least a portion that is outside of an edge of the hole with a distance maintained relative to the edge of the hole when viewed in a direction perpendicular or substantially perpendicular to the second surface. A material of the third electrode layer has a smaller rate of etching by $CF_4$ gas than a material of the second electrode layer.

According to preferred embodiments of the present invention, when a through-hole is to be formed in a single-crystal piezoelectric layer, a hole can be prevented from being formed in a member that is on a side of the electrode layer opposite to the single-crystal piezoelectric layer.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Piezoelectric elements according to preferred embodiments of the present invention will be described below with reference to the drawings. In the following description of the preferred embodiments, the same or corresponding portions among the drawings are denoted by the same reference signs, and description of those portions is not repeated.

Preferred Embodiment 1

Figure 1:
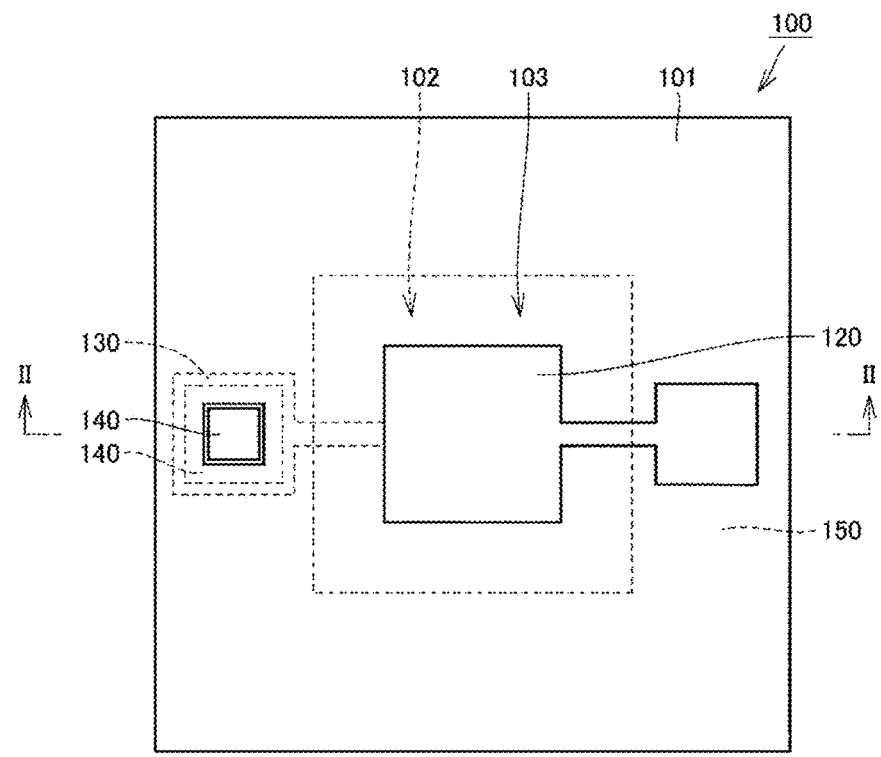
FIG. 1 is a plan view of a piezoelectric element according to Preferred Embodiment 1 of the present invention.
Figure 2:
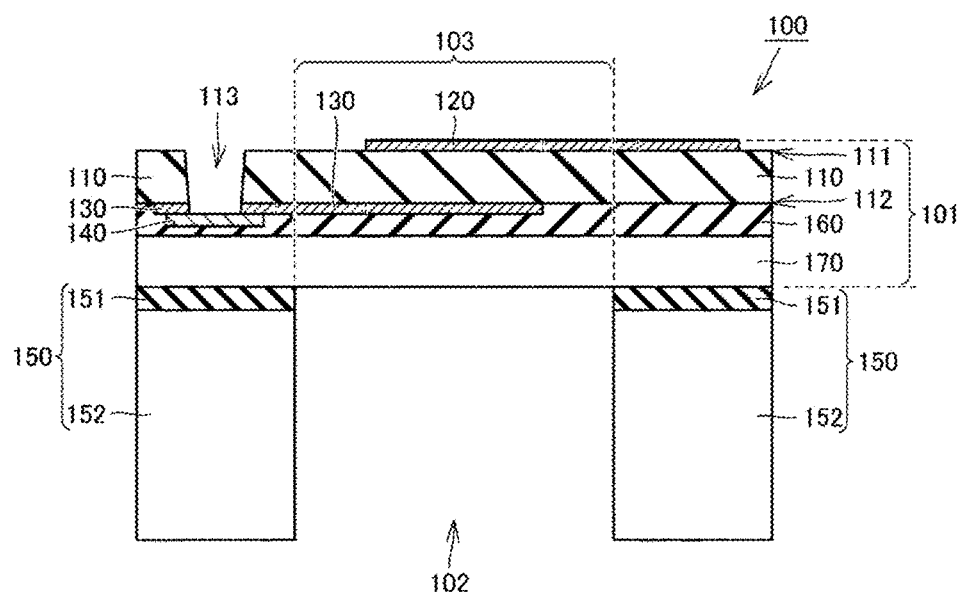
FIG. 2 is a sectional view of the piezoelectric element of FIG. 1 taken along a line II-II when viewed in a direction denoted by arrow.

FIG. 1 is a plan view of a piezoelectric element according to Preferred Embodiment 1 of the present invention. FIG. 2 is a sectional view of the piezoelectric element of FIG. 1 taken along a line II-II when viewed in a direction denoted by arrow.

As illustrated in FIGS. 1 and 2, the piezoelectric element 100 according to Preferred Embodiment 1 of the present invention includes a single-crystal piezoelectric layer 110, a first electrode layer 120, a second electrode layer 130, a third electrode layer 140, and a base portion 150. In the present preferred embodiment, the first electrode layer 120, the second electrode layer 130, and the third electrode layer 140 may each be, for example, an epitaxially grown film.

As illustrated in FIG. 2, the single-crystal piezoelectric layer 110 includes a first surface 111, a second surface 112, and a through-hole 113. The second surface 112 is on an opposite side to the first surface 111.

Figure 3:
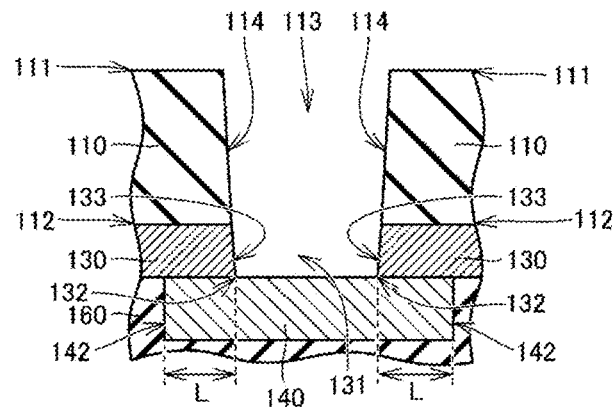
FIG. 3 is a sectional view illustrating a through-hole in the piezoelectric element according to Preferred Embodiment 1 of the present invention and an area surrounding the through-hole.

FIG. 3 is a sectional view illustrating the through-hole in the piezoelectric element according to Preferred Embodiment 1 of the present invention and an area surrounding the through-hole. As illustrated in FIG. 3, the through-hole 113 penetrates from the first surface 111 to the second surface 112. An inner cross-section surface 114 is provided in the single-crystal piezoelectric layer 110 to face the through-hole 113.

In the present preferred embodiment, the single-crystal piezoelectric layer 110 is made of, for example, a lithium compound. More specifically, the lithium compound is, for example, lithium niobate ($LiNbO_3$) or lithium tantalate ($LiTaO_3$).

As illustrated in FIGS. 1 and 2, the first electrode layer 120 is provided on the first surface 111 of the single-crystal piezoelectric layer 110. The first electrode layer 120 is made of Al or Pt, for example. An adhesion layer made of Ti, for example, may be provided between the first electrode layer 120 and the single-crystal piezoelectric layer 110.

The second electrode layer 130 is provided on the second surface 112 of the single-crystal piezoelectric layer 110. At least a portion of the second electrode layer 130 is opposed to the first electrode layer 120 with the single-crystal piezoelectric layer 110 interposed therebetween. Accordingly, from the viewpoint of piezoelectric efficiency in the single-crystal piezoelectric layer 110, the second electrode layer 130 is preferably made of a material with a lower electrical resistivity than that of the third electrode layer 140.

As illustrated in FIG. 3, a hole 131 continuous with the through-hole 113 is provided in the second electrode layer 130. In the present preferred embodiment, the hole 131 penetrates through the second electrode layer 130 in a direction perpendicular or substantially perpendicular to the second surface 112. The hole 131 is not always needed to penetrate through the second electrode layer 130.

The second electrode layer 130 is made of, for example, Pt, Ti, Al, Cu, Au, Ag, Mg, or an alloy including at least one of the metals as a main ingredient. Here, the wording "a main ingredient of a member" indicates an ingredient of the member, the ingredient having an atomic concentration of 50% or more with respect to all ingredients of the member. In the present preferred embodiment, the second electrode layer 130 includes, for example, Pt as the main ingredient. An adhesion layer made of Ti or NiCr, for example, may be provided between the second electrode layer 130 and the single-crystal piezoelectric layer 110.

As illustrated in FIGS. 1 and 2, the third electrode layer 140 is provided on one side of the second electrode layer 130 opposite to the single-crystal piezoelectric layer 110.

As illustrated in FIG. 3, the third electrode layer 140 is includes at least a portion that is outside of an edge 132 of the hole 131 with a distance maintained relative to the edge 132 of the hole 131 when viewed in the direction perpendicular or substantially perpendicular to the second surface 112. More specifically, the third electrode layer 140 includes an outer peripheral edge 142 surrounding the edge 132 of the hole 131 with a distance maintained relative to the edge 132 of the hole 131 when viewed in the direction perpendicular or substantially perpendicular to the second surface 112. In the present preferred embodiment, a minimum size L of the distance between the edge 132 and the outer peripheral edge 142 is greater than an average thickness of the second electrode layer 130. The minimum size L of the distance is not smaller than about 10 times the average thickness of the second electrode layer 130.

As illustrated in FIGS. 2 and 3, the outer peripheral edge 142 of the third electrode layer 140 is inside of an outer peripheral edge of the second electrode layer 130 when viewed in the direction perpendicular or substantially perpendicular to the second surface 112. In the present preferred embodiment, the average thickness of the second electrode layer 130 is thinner than that of the third electrode layer 140. Here, the wording "the average thickness of each of the second electrode layer 130 and the third electrode layer 140" indicates a value obtained by measuring thicknesses of each of the second electrode layer 130 and the third electrode layer 140 at five locations arbitrarily selected from a contact portion between the second electrode layer 130 and the third electrode layer 140 when looking at the piezoelectric element 100 according to the present preferred embodiment in the sectional view illustrated in FIG. 3, and by averaging the thicknesses measured at those five locations.

The third electrode layer 140 is made of, for example, Ni, W, Mo, Ta, or an alloy, such as NiCr, including Ni as the main ingredient. In the present preferred embodiment, for example, the third electrode layer 140 is made of Ni or an alloy including Ni as the main ingredient. An adhesion layer made of Ti or NiCr, for example, may be provided between the second electrode layer 130 and the third electrode layer 140.

The material of the third electrode layer 140 has a smaller rate of etching by $CF_4$ gas than that of the second electrode layer 130. The material of the third electrode layer 140 has a smaller rate of etching by the $CF_4$ gas than that of the single-crystal piezoelectric layer 110.

In the piezoelectric element 100 according to Preferred Embodiment 1 of the present invention, a recess may be provided in the third electrode layer 140.

Figure 4:
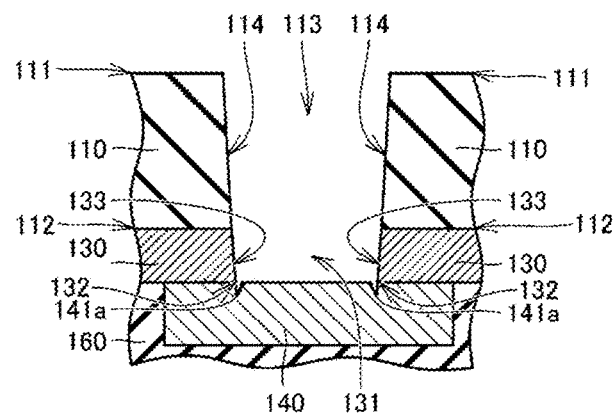
FIG. 4 is a sectional view illustrating a through-hole in a piezoelectric element according to a first modification of Preferred Embodiment 1 of the present invention and an area surrounding the through-hole.

FIG. 4 is a sectional view illustrating a through-hole in a piezoelectric element according to a first modification of Preferred Embodiment 1 of the present invention and an area surrounding the through-hole. As illustrated in FIG. 4, in the first modification of Preferred Embodiment 1 of the present invention, a recess 141a in continuity with the hole 131 in the second electrode layer 130 is formed in the third electrode layer 140. In this modification, the recess 141a continuously extends along an inner surface 133 of the second electrode layer 130 and is positioned inside the edge 132 of the hole 131 when viewed in the direction perpendicular or substantially perpendicular to the second surface 112.

Figure 5:
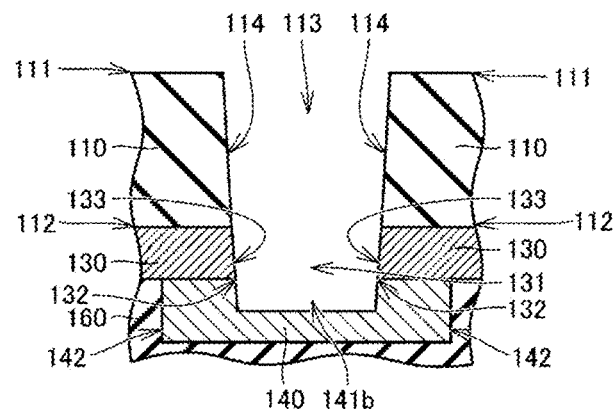
FIG. 5 is a sectional view illustrating a through-hole in a piezoelectric element according to a second modification of Preferred Embodiment 1 of the present invention and an area surrounding the through-hole.

FIG. 5 is a sectional view illustrating a through-hole in a piezoelectric element according to a second modification of Preferred Embodiment 1 of the present invention and surroundings of the through-hole. As illustrated in FIG. 5, in the second modification of Preferred Embodiment 1 of the present invention, a recess 141b continuous with the hole 131 in the second electrode layer 130 is provided in the third electrode layer 140 corresponding to an entire region of the hole 131. In this modification, the inner surface 133 of the hole 131 and an inner surface of the recess 141b are continuous with each other.

Figure 6:
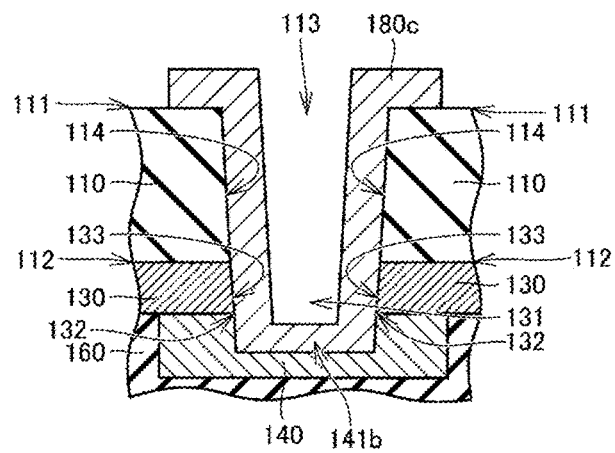
FIG. 6 is a sectional view illustrating a through-hole in a piezoelectric element according to a third modification of Preferred Embodiment 1 of the present invention and an area surrounding the through-hole.

In the piezoelectric element 100 according to Preferred Embodiment 1 of the present invention, a connection electrode may be provided. FIG. 6 is a sectional view illustrating a through-hole in a piezoelectric element according to a third modification of Preferred Embodiment 1 of the present invention and surroundings of the through-hole. As illustrated in FIG. 6, in the third modification of Preferred Embodiment 1 of the present invention, a connection electrode 180c is provided in the through-hole 113 in the second modification of Preferred Embodiment 1 of the present invention illustrated in FIG. 5.

In this modification, as illustrated in FIG. 6, the connection electrode 180c is continuously provided over a region spanning from a position on the inner surface 133 defining the hole 131 in the second electrode layer 130 to a portion of the third electrode layer 140, the portion facing the hole 131. In this modification, the connection electrode 180c is provided over the entire or substantially the entire inner surface of the recess 141b. Furthermore, the connection electrode 180c is continuously disposed over a region spanning from a position on the inner surface 133 defining the hole 131 in the second electrode layer 130 to a position on an inner cross-section surface 114 of the single-crystal piezoelectric layer 110.

As illustrated in FIG. 2, the piezoelectric element 100 according to Preferred Embodiment 1 of the present invention further includes the intermediate layer 160 and the support layer 170. In the present preferred embodiment, the intermediate layer 160 is disposed on a surface of the third electrode layer 140 on an opposite side to the second electrode layer 130, on a portion of a surface of the second electrode layer 130 on an opposite side to the single-crystal piezoelectric layer 110, the portion not being covered with the third electrode layer 140, and on a portion of the second surface 112 of the single-crystal piezoelectric layer 110, the portion not being covered with the second electrode layer 130. The intermediate layer 160 is a layer made of $SiO_2$, for example.

In the present preferred embodiment, the support layer 170 is disposed on a surface of the intermediate layer 160 on an opposite side to the single-crystal piezoelectric layer 110. The support layer is made of Si, for example. A joining layer made of metal may be provided between the intermediate layer 160 and the support layer 170.

As illustrated in FIG. 2, in the piezoelectric element 100 according to Preferred Embodiment 1 of the present invention, a multilayer body 101 includes at least the first electrode layer 120, the single-crystal piezoelectric layer 110, the second electrode layer 130, and the third electrode layer 140. In the present preferred embodiment, the multilayer body 101 further includes the intermediate layer 160 and the support layer 170. The base portion 150 supports the multilayer body 101.

The base portion 150 is provided on one side of the multilayer body 101 opposite to the first electrode layer 120. The base portion 150 has an annular shape extending along a peripheral edge of the multilayer body 101 when viewed in a lamination direction of the multilayer body 101.

As illustrated in FIG. 2, in the present preferred embodiment, for example, the base portion 150 is defined by a silicon oxide layer 151 provided on a side closer to the multilayer body 101 and a single-crystal silicon layer 152 provided on an opposite side to the multilayer body 101. In the present preferred embodiment, the silicon oxide layer 151 is in contact with the support layer 170.

As illustrated in FIGS. 1 and 2, in the piezoelectric element 100 according to the present preferred embodiment, a cavity 102 is provided inside the base portion 150 when viewed in the lamination direction. Furthermore, in the present preferred embodiment, a membrane portion 103 is provided in the multilayer body 101. The membrane portion 103 overlaps the cavity 102 but does not overlap the base portion 150 when viewed in the lamination direction.

In the piezoelectric element 100 according to the present preferred embodiment, when a voltage is applied between the first electrode layer 120 and the second electrode layer 130, the single-crystal piezoelectric layer 110 positioned between the first electrode layer 120 and the second electrode layer 130 is driven so as to be distorted. This enables the membrane portion 103 to flex and vibrate to a large extent in the lamination direction of the multilayer body 101. The piezoelectric element 100 according to the present preferred embodiment can be used as, for example, an ultrasonic transducer.

A non-limiting example of a method of manufacturing the piezoelectric element according to Preferred Embodiment 1 of the present invention will be described below. Sectional views of FIGS. 7 to 14, described below, are each illustrated as a sectional view the same as or similar to that of FIG. 2.

Figure 7:
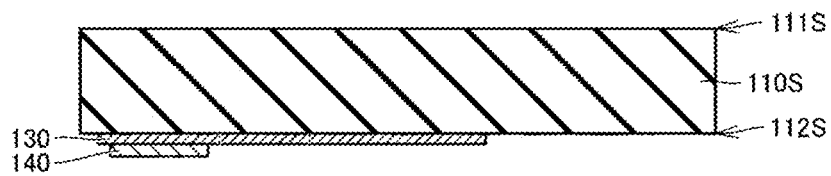
FIG. 7 is a sectional view illustrating a state in which a second electrode layer and a third electrode layer are formed on a piezoelectric single-crystal substrate in a non-limiting example of a method of manufacturing the piezoelectric element according to Preferred Embodiment 1 of the present invention.

FIG. 7 is a sectional view illustrating a state in which the second electrode layer and the third electrode layer are formed on the piezoelectric single-crystal substrate in the method of manufacturing the piezoelectric element according to Preferred Embodiment 1 of the present invention. As illustrated in FIG. 7, the piezoelectric single-crystal substrate 110S includes a first principal surface 111S and a second principal surface 112S on an opposite side to the first principal surface 111S. The second electrode layer 130 is formed on the second principal surface 112S. The third electrode layer 140 is formed on the surface of the second electrode layer 130 on the opposite side to the piezoelectric single-crystal substrate 110S. The second electrode layer 130 and the third electrode layer 140 are each formed by patterning using a photolithography process or a vapor deposition lift-off process, for example.

Figure 8:
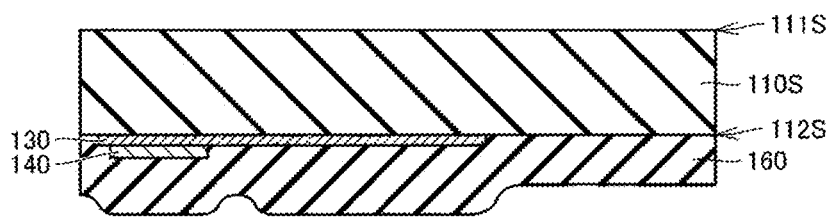
FIG. 8 is a sectional view illustrating a state in which an intermediate layer is formed on a second principal surface side of the piezoelectric single-crystal substrate in the non-limiting example of a method of manufacturing the piezoelectric element according to Preferred Embodiment 1 of the present invention.

FIG. 8 is a sectional view illustrating a state in which the intermediate layer is formed on a second principal surface side of the piezoelectric single-crystal substrate in the method of manufacturing the piezoelectric element according to Preferred Embodiment 1 of the present invention. As illustrated in FIG. 8, the intermediate layer 160 is formed on the surfaces of the piezoelectric single-crystal substrate 110S, the second electrode layer 130, and the third electrode layer 140 by a CVD (Chemical Vapor Deposition) process or a PVD (Physical Vapor Deposition) process, for example.

Figure 9:
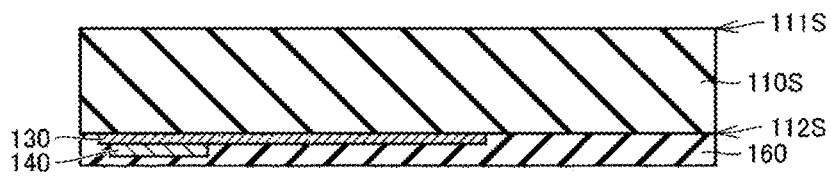
FIG. 9 is a sectional view illustrating a state in which the intermediate layer is polished in the non-limiting example of a method of manufacturing the piezoelectric element according to Preferred Embodiment 1 of the present invention.

FIG. 9 is a sectional view illustrating a state in which the intermediate layer is polished in the method of manufacturing the piezoelectric element according to Preferred Embodiment 1 of the present invention. As illustrated in FIG. 9, the surface of the intermediate layer 160 on an opposite side to the piezoelectric single-crystal substrate 110S is planarized by CMP (Chemical Mechanical Polishing), for example.

Figure 10:
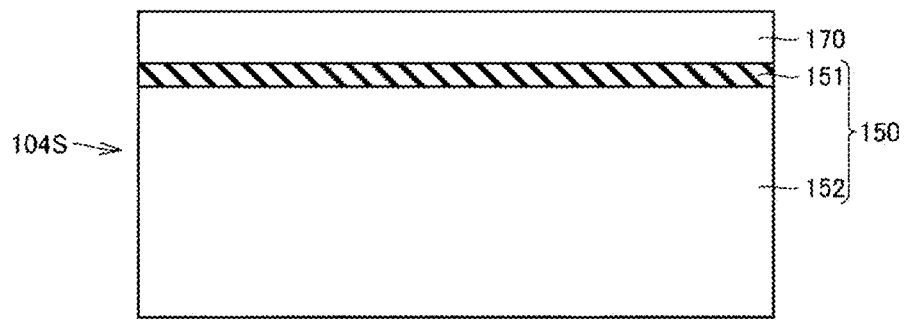
FIG. 10 is a sectional view illustrating a state in which a multilayer substrate including a base portion is prepared in the non-limiting example of a method of manufacturing the piezoelectric element according to Preferred Embodiment 1 of the present invention.

FIG. 10 is a sectional view illustrating a state in which a multilayer substrate including the base portion is prepared in the method of manufacturing the piezoelectric element according to Preferred Embodiment 1 of the present invention. As illustrated in FIG. 10, the multilayer substrate 104S including the support layer 170 and the base portion 150 is prepared. In the present preferred embodiment, the multilayer substrate 104S is, for example, an SOI (Silicon on Insulator) substrate.

Figure 11:
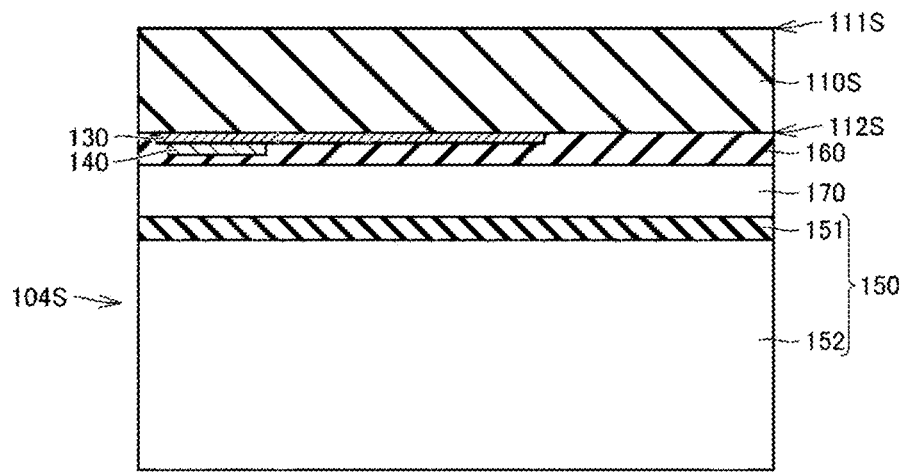
FIG. 11 is a sectional view illustrating a state in which the multilayer substrate is joined to the intermediate layer in the non-limiting example of a method of manufacturing the piezoelectric element according to Preferred Embodiment 1 of the present invention.

FIG. 11 is a sectional view illustrating a state in which the multilayer substrate is joined to the intermediate layer in the method of manufacturing the piezoelectric element according to Preferred Embodiment 1 of the present invention. As illustrated in FIG. 11, the intermediate layer 160 is joined to a surface of the multilayer substrate 104S on a side including the support layer 170.

Figure 12:
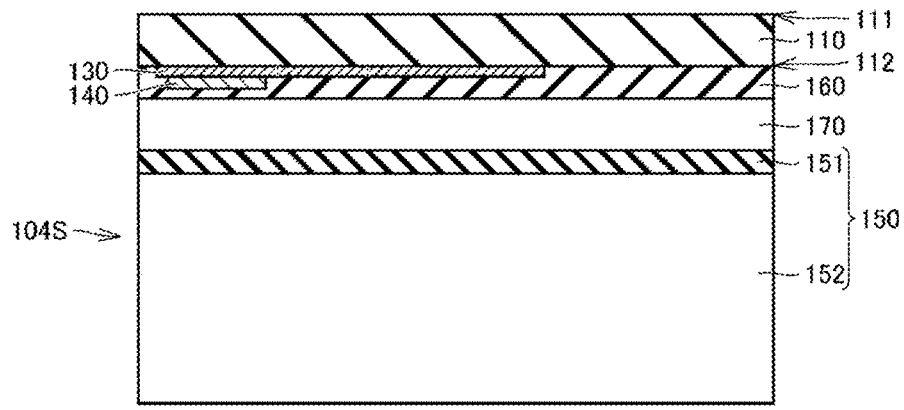
FIG. 12 is a sectional view illustrating a state in which a piezoelectric layer is formed by grinding the piezoelectric single-crystal substrate in the non-limiting example of a method of manufacturing the piezoelectric element according to Preferred Embodiment 1 of the present invention.

FIG. 12 is a sectional view illustrating a state in which a piezoelectric layer is formed by grinding the piezoelectric single-crystal substrate in the method of manufacturing the piezoelectric element according to Preferred Embodiment 1 of the present invention. As illustrated in FIGS. 11 and 12, the single-crystal piezoelectric layer 110 is formed by grinding a portion of the piezoelectric single-crystal substrate 110S on a side including the first principal surface 111S to reduce a thickness with a grinder, and then by polishing the above-mentioned portion on an opposite side to be planarized with CMP, for example.

A release layer may be formed on the first principal surface 111S of the piezoelectric single-crystal substrate 110S by injecting ions therein in advance. In the case of forming the release layer before joining the piezoelectric single-crystal substrate 110S to the multilayer substrate 104S, the single-crystal piezoelectric layer 110 can be formed by removing the release layer after joining the piezoelectric single-crystal substrate 110S. The single-crystal piezoelectric layer 110 may be formed by further polishing the piezoelectric single-crystal substrate 110S with CMP, for example, after removing the release layer.

Figure 13:
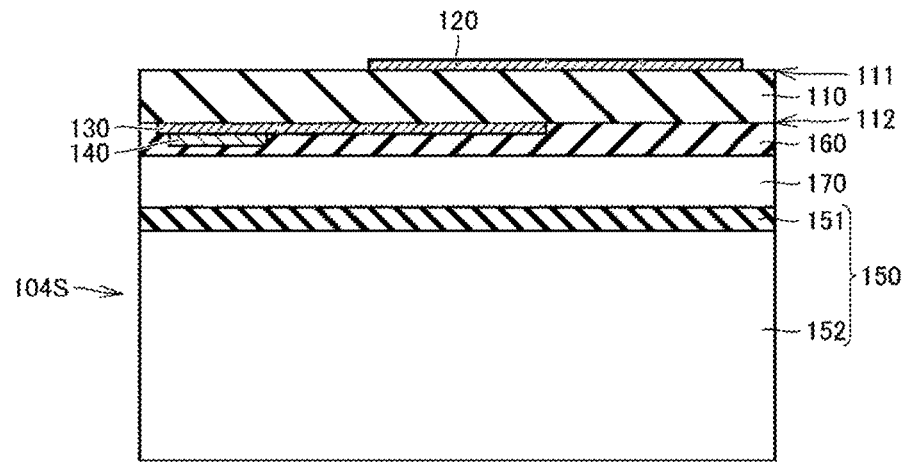
FIG. 13 is a sectional view illustrating a state in which a first electrode layer is formed in the non-limiting example of a method of manufacturing the piezoelectric element according to Preferred Embodiment 1 of the present invention.

FIG. 13 is a sectional view illustrating a state in which the first electrode layer is formed in the method of manufacturing the piezoelectric element according to Preferred Embodiment 1 of the present invention. As illustrated in FIG. 13, the first electrode layer 120 is laminated on the first surface 111 of the single-crystal piezoelectric layer 110 such that at least a portion of the first electrode layer 120 is opposed to the second electrode layer 130 with the single-crystal piezoelectric layer 110 interposed therebetween. The first electrode layer 120 is formed by patterning using the photolithography process or the vapor deposition lift-off process, for example.

Figure 14:
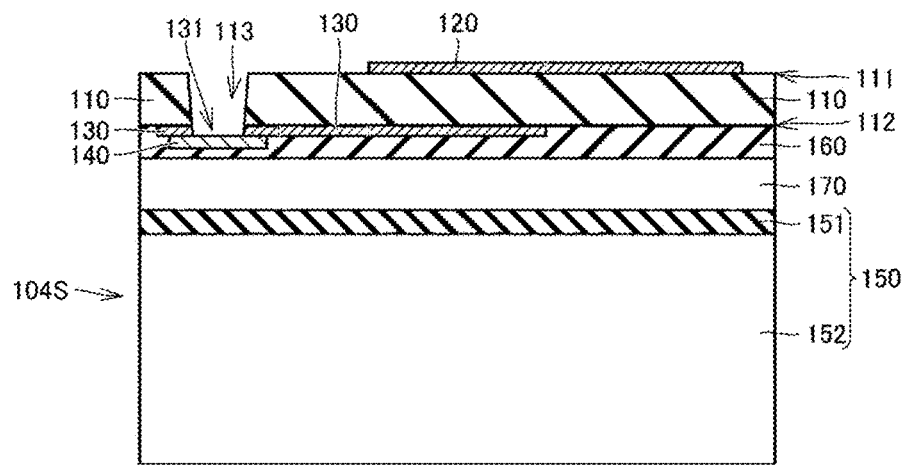
FIG. 14 is a sectional view illustrating a state in which the through-hole is formed in the non-limiting example of a method of manufacturing the piezoelectric element according to Preferred Embodiment 1 of the present invention.

FIG. 14 is a sectional view illustrating a state in which the through-hole is formed in the method of manufacturing the piezoelectric element according to Preferred Embodiment 1 of the present invention. As illustrated in FIG. 14, in the present preferred embodiment, the through-hole 113 is formed in the single-crystal piezoelectric layer 110 and the hole 131 is formed in the second electrode layer 130 by, for example, RIE (Reactive Ion Etching) using the $CF_4$ gas. In the second to fourth modifications of the piezoelectric element according to Preferred Embodiment 1 of the present invention, the recesses 141a and 141b illustrated in FIGS. 4 to 6 are further formed by continuously performing the RIE on the third electrode layer 140 after forming the hole 131.

Finally, as illustrated in FIG. 2, the cavity 102 is formed by etching the single-crystal silicon layer 152 and the silicon oxide layer 151 from one side of the base portion 150 opposite to the single-crystal piezoelectric layer 110 by, for example, deep reactive ion etching (Deep RIE). In addition, the connection electrode 180c is provided as illustrated in FIG. 6 when required.

The piezoelectric element 100 according to Preferred Embodiment 1 of the present invention, illustrated in FIGS. 1 to 6, is manufactured through the above-described steps.

Figure 15:
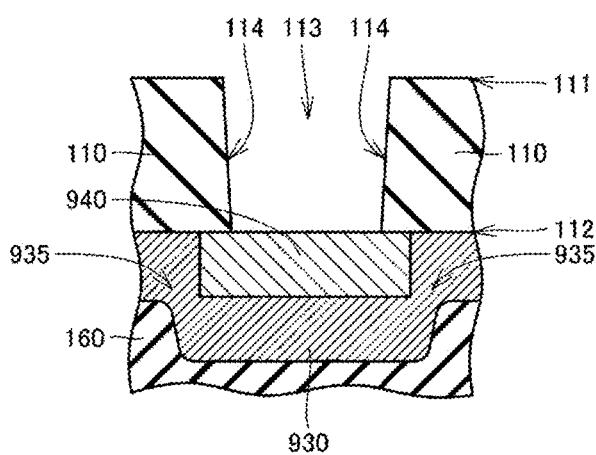
FIG. 15 illustrates a through-hole in a piezoelectric element according to Comparative Example and an area surrounding the through-hole.

A piezoelectric element according to Comparative Example is described here. FIG. 15 illustrates a through-hole in a piezoelectric element according to Comparative Example and an area surrounding the through-hole. As illustrated in FIG. 15, in the piezoelectric element according to Comparative Example, unlike the piezoelectric element 100 according to Preferred Embodiment 1 of the present invention, a third electrode layer 940 faces the through-hole 113, while a second electrode layer 930 is provided on the second surface 112 of the single-crystal piezoelectric layer 110 and is further provided on a surface of the third electrode layer 940 on an opposite side to the single-crystal piezoelectric layer 110.

Also in this Comparative Example, when the etching is performed to form the through-hole 113, etching of a member positioned on one side of the second electrode layer 930 opposite to the single-crystal piezoelectric layer 110 can be reduced or prevented with the presence of the third electrode layer 940. In this Comparative Example, however, the second electrode layer 930 includes a neck portion 935 at which a portion of the second electrode layer 930, the portion being provided on the surface of the third electrode layer 940 on the opposite side to the single-crystal piezoelectric layer 110, and a portion of the second electrode layer 930, the portion being provided on the second surface 112 of the single-crystal piezoelectric layer 110, are connected to each other. Therefore, stress may concentrate in the neck portion 935, and cracking may occur in some cases. If the cracking occurs, the third electrode layer 940 and the second electrode layer 930 are electrically connected substantially only at a peripheral surface of the third electrode layer 940. This may cause a problem that a sufficient contact area cannot be ensured between the third electrode layer 940 and the second electrode layer 930.

In contrast, in the piezoelectric element 100 according to Preferred Embodiment 1 of the present invention, the third electrode layer 140 is provided on the one side of the second electrode layer 130 opposite to the single-crystal piezoelectric layer 110. The third electrode layer 140 includes at least the portion that is outside of the edge 132 of the hole 131 with the distance maintained relative to the edge 132 of the hole 131 when viewed in the direction perpendicular or substantially perpendicular to the second surface 112. The second electrode layer 130 is made of, for example, Pt, Ti, Al, Cu, Au, Ag, Mg, or the alloy including at least one of the metals as the main ingredient. The third electrode layer 140 is made of, for example, Ni or the alloy including Ni as the main ingredient.

Thus, since the third electrode layer 140 acting as an etching stop layer during the formation of the through-hole 113 is provided as described above, concentration of stress on the second electrode layer 130 can be relieved. In addition, the occurrence of cracking in the second electrode layer 130 can be reduced or prevented.

As described above, the piezoelectric element 100 according to Preferred Embodiment 1 of the present invention includes the third electrode layer 140 below the second electrode layer 130.

Thus, when the through-hole 113 is formed to extend from the first surface side of the single-crystal piezoelectric layer 110 to the second surface side by etching, the etching can be stopped at the second electrode layer 130. Moreover, a hole can be prevented from being formed in a member provided on the one side of the second electrode layer 130 opposite to the single-crystal piezoelectric layer 110, namely a member provided on one side of the third electrode layer 140 opposite to the single-crystal piezoelectric layer 110.

In the piezoelectric element 100 according to Preferred Embodiment 1 of the present invention, the material of the third electrode layer 140 has a smaller rate of etching by the $CF_4$ gas than that of the second electrode layer 130.

Thus, since the third electrode layer 140 having a smaller rate of etching by the $CF_4$ gas than the second electrode layer 130 is provided as described above, the third electrode layer 140 acts as an etching stop layer, and the concentration of stress on the second electrode layer 130 can be relieved. Moreover, the occurrence of cracking in the second electrode layer 130 can be reduced or prevented.

In the present preferred embodiment, the third electrode layer 140 includes the outer peripheral edge 142 surrounding the hole 131 with the distance maintained relative to the edge 132 of the hole 131 when viewed in the direction perpendicular or substantially perpendicular to the second surface 112.

With the above-described feature, a hole can be more effectively prevented from being formed in any, except for the third electrode layer 140, of members provided on the one side of the second electrode layer 130 opposite to the single-crystal piezoelectric layer 110.

In the present preferred embodiment, the material of the third electrode layer 140 has a smaller rate of etching by the $CF_4$ gas than that of the single-crystal piezoelectric layer 110.

With the above-described feature, since the third electrode layer 140 is made of the material that is less likely to be etched than the material of the single-crystal piezoelectric layer 110, formation of a hole penetrating through the third electrode layer 140 can be more effectively prevented.

In the present preferred embodiment, the hole 131 penetrates through the second electrode layer 130 in the direction perpendicular or substantially perpendicular to the second surface 112. The connection electrode 180c may be continuously provided over a region spanning from a position on the inner surface 133 defining the hole 131 in the second electrode layer 130 to a portion of the third electrode layer 140, the portion facing the hole 131.

With the above-described features, since a conductive path conducting directly from the connection electrode 180c to the second electrode layer 130 and a conductive path conducting to the second electrode layer 130 through the third electrode layer 140 are provided, electrical resistance of the entire electrode can be reduced.

In the present preferred embodiment, the minimum size L of the distance is greater than an average thickness of the second electrode layer 130.

With the above-described feature, since a sufficient contact area between the second electrode layer 130 and the third electrode layer 140 can be ensured, electrical resistance of the conductive path conducting from the connection electrode 180c to the second electrode layer 130 through the third electrode layer 140, illustrated in FIG. 6, can be reduced.

In the present preferred embodiment, the recess 141a or 141b continuous with the hole 131 in the second electrode layer 130 may be provided in the third electrode layer 140.

With the above-described feature, when the connection electrode 180c is provided, a contact area between the connection electrode 180c and the third electrode layer 140 can be increased, such that contact resistance between the connection electrode 180c and the third electrode layer 140 can be reduced.

In the present preferred embodiment, the connection electrode 180c may be provided over the entire or substantially the entire inner surface of the recess 141a or 141b.

With the above-described feature, a voltage can be applied to the third electrode layer 140 through the connection electrode 180c in a state in which the contact resistance between the connection electrode 180c and the third electrode layer 140 is further reduced.

In the present preferred embodiment, the single-crystal piezoelectric layer 110 is made of, for example, a lithium compound. Even when the single-crystal piezoelectric layer 110 is made of a lithium compound and is relatively hard to be etched as in the present preferred embodiment, the concentration of stress on the second electrode layer 130 can be relieved because the third electrode layer 140 is provided as described above. Moreover, the occurrence of cracking in the second electrode layer 130 can be reduced or prevented.

In the present preferred embodiment, the lithium compound is, for example, lithium niobate ($LiNbO_3$) or lithium tantalate ($LiTaO_3$). With this feature, a dielectric constant of the single-crystal piezoelectric layer 110 can be reduced. Moreover, drive efficiency of the piezoelectric element 100 can be improved.

In the present preferred embodiment, the second electrode layer 130 includes, for example, Pt as the main ingredient. With this feature, electrical resistance of the second electrode layer 130 can be reduced.

In the present preferred embodiment, the first electrode layer 120, the second electrode layer 130, and the third electrode layer 140 are each, for example, an epitaxially grown film. With this feature, fatigue characteristics of each of the electrode layers are improved, and overall reliability of the piezoelectric element 100 can be improved.

The piezoelectric element 100 according to the present preferred embodiment further includes the base portion 150 supporting the multilayer body 101 that includes at least the first electrode layer 120, the single-crystal piezoelectric layer 110, the second electrode layer 130, and the third electrode layer 140. The base portion 150 is provided on the one side of the multilayer body 101 opposite to the first electrode layer 120. The base portion 150 extends along the peripheral edge of the multilayer body 101 when viewed in the lamination direction of the multilayer body 101.

With the above-described features, driving of the single-crystal piezoelectric layer 110 can be converted to flexing vibration of the membrane portion 103.

In the present preferred embodiment, the base portion 150 is, for example, the silicon oxide layer 151 provided on a side closer to the multilayer body 101 and a single-crystal silicon layer 152 provided on an opposite side to the multilayer body 101. With this feature, the piezoelectric element 100 according to the present preferred embodiment can be used as an ultrasonic transducer.

Preferred Embodiment 2

A piezoelectric element according to Preferred Embodiment 2 of the present invention will be described below. The piezoelectric element according to Preferred Embodiment 2 of the present invention is different from the piezoelectric element 100 according to Preferred Embodiment 1 of the present invention mainly in the configuration of the base portion. Thus, description of the same or similar components to those in the piezoelectric element 100 according to Preferred Embodiment 1 of the present invention is not repeated.

Figure 16:
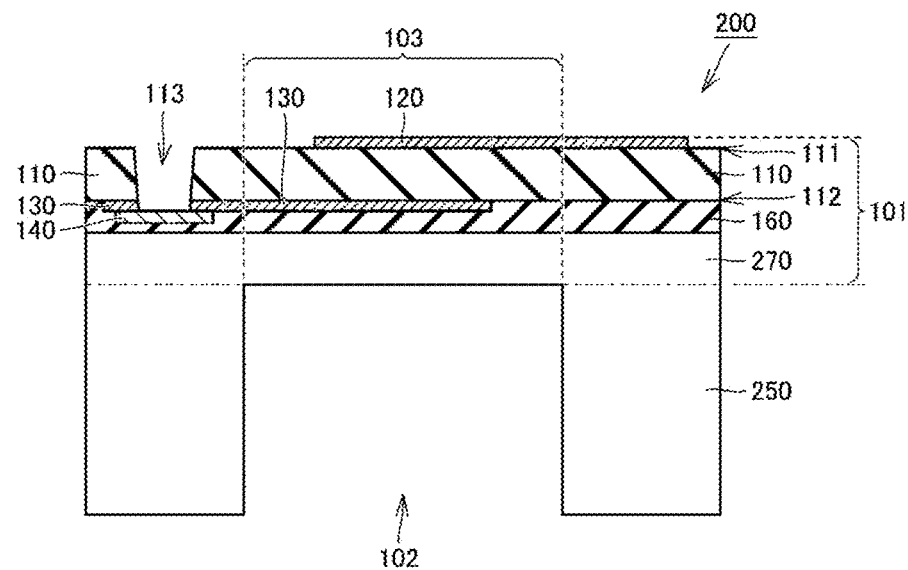
FIG. 16 is a sectional view of a piezoelectric element according to Preferred Embodiment 2 of the present invention.

FIG. 16 is a sectional view of the piezoelectric element according to Preferred Embodiment 2 of the present invention. As illustrated in FIG. 16, in the piezoelectric element 200 according to Preferred Embodiment 2 of the present invention, a base portion 250 is made of, for example, single-crystal silicon. The base portion 250 and the support layer 270 are defined by the same member. The piezoelectric element 200 according to the present preferred embodiment can be used, for example, as a bulk wave resonator.

Figure 17:
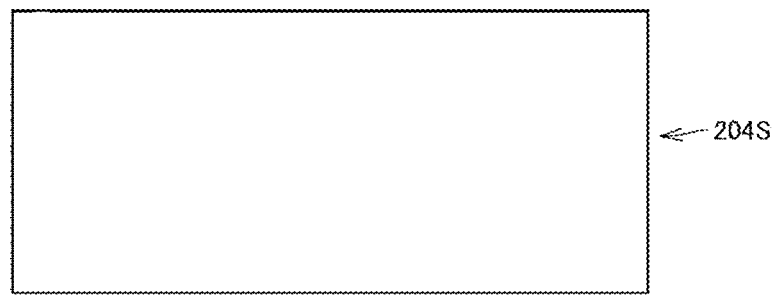
FIG. 17 is a sectional view illustrating a state in which a single-layer substrate including a base portion is prepared in a non-limiting example of a method of manufacturing the piezoelectric element according to Preferred Embodiment 2 of the present invention.

A non-limiting example of a method of manufacturing the piezoelectric element according to Preferred Embodiment 2 of the present invention will be described below. FIG. 17 is a sectional view illustrating a state in which a single-layer substrate including the base portion is prepared in the method of manufacturing the piezoelectric element according to Preferred Embodiment 2 of the present invention. As illustrated in FIG. 17, the single-layer substrate 204S made of single-crystal silicon is prepared.

Figure 18:
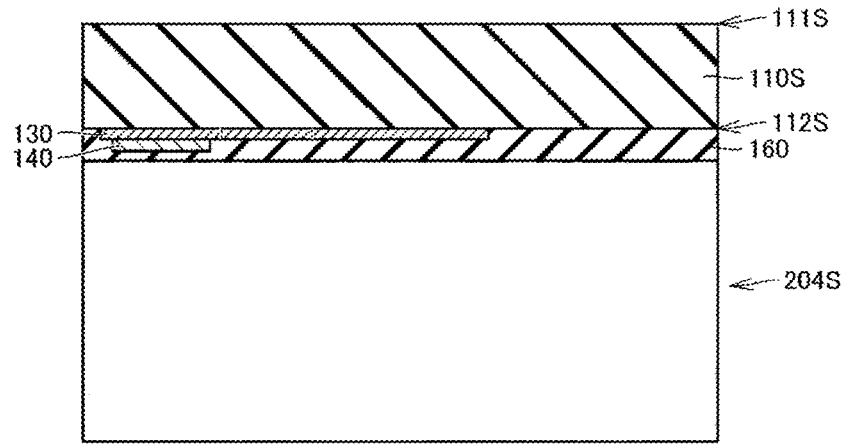
FIG. 18 is a sectional view illustrating a state in which the single-layer substrate is joined to an intermediate layer in the non-limiting example of a method of manufacturing the piezoelectric element according to Preferred Embodiment 2 of the present invention.

FIG. 18 is a sectional view illustrating a state in which the single-layer substrate is joined to an intermediate layer in the method of manufacturing the piezoelectric element according to Preferred Embodiment 2 of the present invention. The intermediate layer 160 in the multilayer body illustrated in FIG. 9 in connection with the method of manufacturing the piezoelectric element 100 according to Preferred Embodiment 1 of the present invention and the single-layer substrate 204S illustrated in FIG. 17 are joined to each other.

Figure 19:
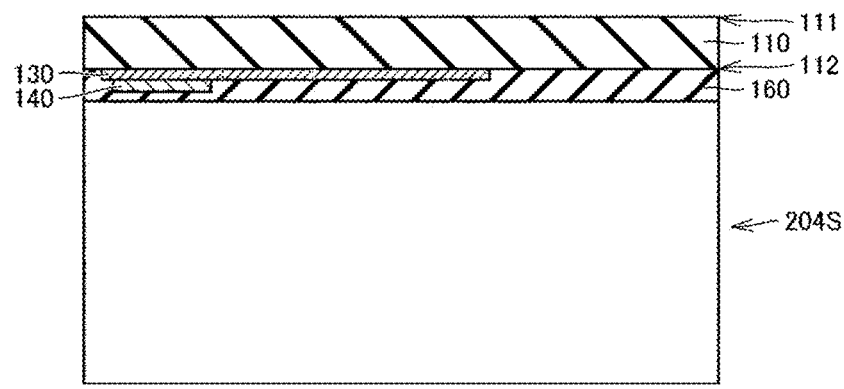
FIG. 19 is a sectional view illustrating a state in which a piezoelectric layer is formed by grinding the piezoelectric single-crystal substrate in the non-limiting example of a method of manufacturing the piezoelectric element according to Preferred Embodiment 2 of the present invention.
Figure 20:
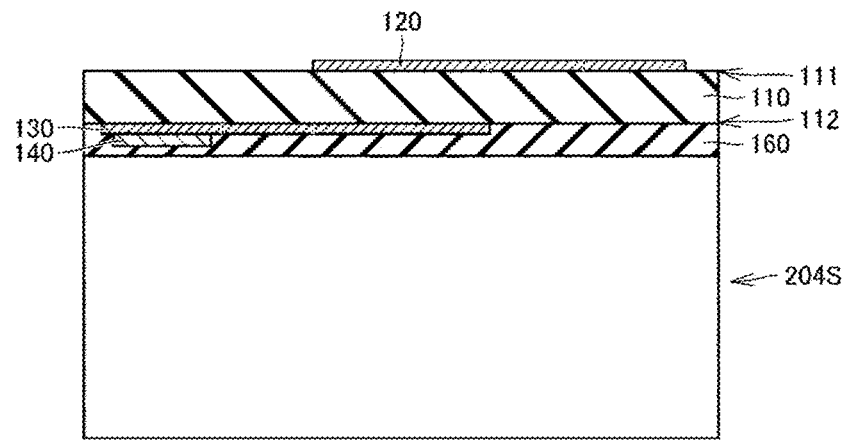
FIG. 20 is a sectional view illustrating a state in which a first electrode layer is formed in the non-limiting example of a method of manufacturing the piezoelectric element according to Preferred Embodiment 2 of the present invention.
Figure 21:
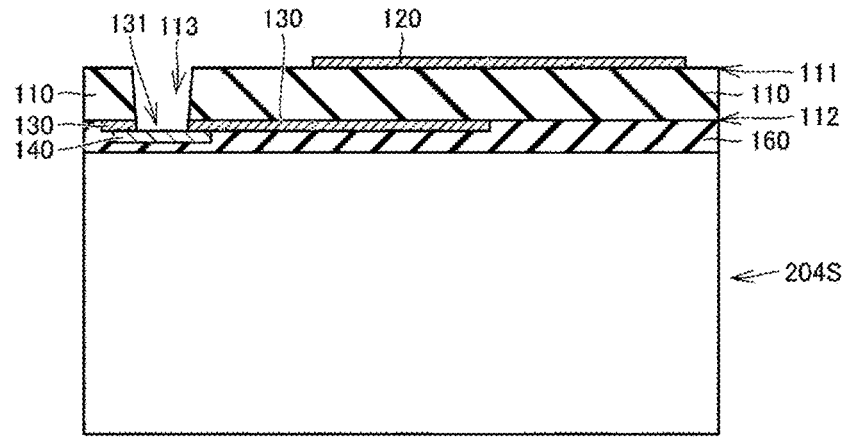
FIG. 21 is a sectional view illustrating a state in which a through-hole is formed in the non-limiting example of a method of manufacturing the piezoelectric element according to Preferred Embodiment 2 of the present invention.

FIG. 19 is a sectional view illustrating a state in which a piezoelectric layer is formed by grinding the piezoelectric single-crystal substrate in the method of manufacturing the piezoelectric element according to Preferred Embodiment 2 of the present invention. FIG. 20 is a sectional view illustrating a state in which a first electrode layer is formed in the method of manufacturing the piezoelectric element according to Preferred Embodiment 2 of the present invention. FIG. 21 is a sectional view illustrating a state in which a through-hole is formed in the method of manufacturing the piezoelectric element according to Preferred Embodiment 2 of the present invention. As illustrated in FIGS. 19 to 21, in the method of manufacturing the piezoelectric element 200 according to Preferred Embodiment 2 of the present invention, the single-crystal piezoelectric layer 110 is formed, the first electrode layer 120 is formed, and the through-hole 113 and the hole 131 are formed as in the method of manufacturing the piezoelectric element 100 according to Preferred Embodiment 1 of the present invention. In addition, a recess is formed in the third electrode layer 140 when required.

Finally, the single-layer substrate 204S is etched from one side opposite to the single-crystal piezoelectric layer 110 by, for example, deep reactive ion etching. As a result, the base portion 250 and the support layer 270 illustrated in FIG. 16 are formed. Through the above-described steps, the piezoelectric element 200, illustrated in FIG. 16, according to Preferred Embodiment 2 of the present invention is manufactured.

The present preferred embodiment can also relieve the concentration of stress on the second electrode layer 130 because the second electrode layer 130 and the third electrode layer 140 are provided as in the piezoelectric element 100 according to Preferred Embodiment 1 of the present invention. Moreover, the present preferred embodiment can reduce or prevent the occurrence of cracking in the second electrode layer 130.

Preferred Embodiment 3

A piezoelectric element according to Preferred Embodiment 3 of the present invention will be described below. The piezoelectric element according to Preferred Embodiment 3 of the present invention is different from the piezoelectric element 200 according to Preferred Embodiment 2 of the present invention mainly in the configuration of the first electrode layer. Thus, description of the same or similar components to those in the piezoelectric element 200 according to Preferred Embodiment 2 of the present invention is not repeated.

Figure 22:
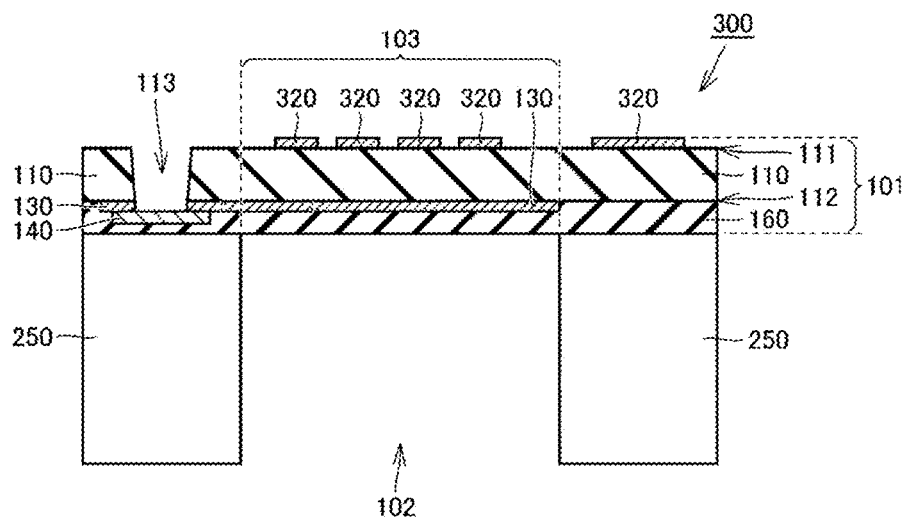
FIG. 22 is a sectional view of a piezoelectric element according to Preferred Embodiment 3 of the present invention.

FIG. 22 is a sectional view of the piezoelectric element according to Preferred Embodiment 3 of the present invention. As illustrated in FIG. 22, in the piezoelectric element 300 according to Preferred Embodiment 3 of the present invention, a first electrode layer 320 has a comb shape when viewed in a direction perpendicular or substantially perpendicular to the first surface 111. With the above-described configuration, the piezoelectric element 300 can be used, for example, as an acoustic wave device using a Lamb wave. Here, "Lamb wave" is a collective term indicating various waves that are excited in the single-crystal piezoelectric layer 110 with a film thickness of about 1λ or less on an assumption that the wavelength of an excited Lamb wave is denoted by 1λ. Furthermore, the piezoelectric element 300 according to the present preferred embodiment does not include the support layer, and the intermediate layer 160 and the base portion 250 are in direct contact with each other.

The present preferred embodiment can also relieve the concentration of stress on the second electrode layer 130 because the second electrode layer 130 and the third electrode layer 140 are provided as in the piezoelectric element 100 according to Preferred Embodiment 1 of the present invention. Moreover, the present preferred embodiment can reduce or prevent the occurrence of cracking in the second electrode layer 130.

Preferred Embodiment 4

A piezoelectric element according to Preferred Embodiment 4 of the present invention will be described below. The piezoelectric element according to Preferred Embodiment 4 of the present invention is different from the piezoelectric element 100 according to Preferred Embodiment 1 of the present invention mainly in that a through-slit is provided. Thus, description of the same or similar components to those in the piezoelectric element 100 according to Preferred Embodiment 1 of the present invention is not repeated.

Figure 23:
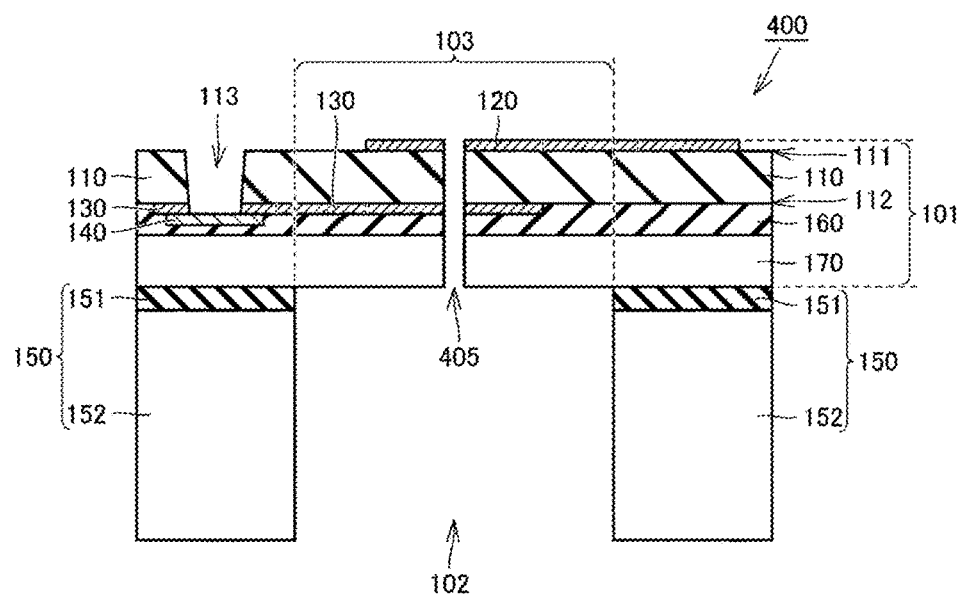
FIG. 23 is a sectional view of a piezoelectric element according to Preferred Embodiment 4 of the present invention.

FIG. 23 is a sectional view of the piezoelectric element according to Preferred Embodiment 4 of the present invention. As illustrated in FIG. 23, in the piezoelectric element 400 according to Preferred Embodiment 4 of the present invention, the through-slit 405 is provided in the multilayer body 101 so as to communicate with the cavity 102 that is provided inside the base portion 150 when viewed in the lamination direction. With the above-described configuration, the flexing vibration of the membrane portion 103 is increased, such that device characteristics of the piezoelectric element 100 can be improved.

The combinable features in the above description of the preferred embodiments may be combined with each other.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A piezoelectric element comprising:
    a single-crystal piezoelectric layer including a first surface, a second surface on an opposite side to the first surface, and a through-hole penetrating from the first surface to the second surface;
    a first electrode layer on a first surface side of the single-crystal piezoelectric layer;
    a second electrode layer on a second surface side of the single-crystal piezoelectric layer and including a hole continuous with the through-hole, at least a portion of the second electrode layer being opposed to the first electrode layer with the single-crystal piezoelectric layer interposed therebetween; and
    a third electrode layer on a side of the second electrode layer opposite to the single-crystal piezoelectric layer and including at least a portion outside of an edge of the hole with a distance maintained relative to the edge of the hole when viewed in a direction perpendicular or substantially perpendicular to the second surface; wherein
    the second electrode layer is made of Pt, Ti, Al, Cu, Au, Ag, or Mg, or an alloy including at least one of Pt, Ti, Al, Cu, Au, Ag, or Mg as a main ingredient; and
    the third electrode layer is made of Ni or an alloy including Ni as a main ingredient.

2. The piezoelectric element according to claim 1, wherein a material of the third electrode layer has a smaller rate of etching by $CF_4$ gas than a material of the second electrode layer.

3. A piezoelectric element comprising:
    a single-crystal piezoelectric layer including a first surface, a second surface on an opposite side to the first surface, and a through-hole penetrating from the first surface to the second surface;
    a first electrode layer on a first surface side of the single-crystal piezoelectric layer;
    a second electrode layer on a second surface side of the single-crystal piezoelectric layer and including a hole continuous with the through-hole, at least a portion of the second electrode layer being opposed to the first electrode layer with the single-crystal piezoelectric layer interposed therebetween; and a third electrode layer on a side of the second electrode layer opposite to the single-crystal piezoelectric layer and including at least a portion outside of an edge of the hole with a distance maintained relative to the edge of the hole when viewed in a direction perpendicular or substantially perpendicular to the second surface; wherein a material of the third electrode layer has a smaller rate of etching by $CF_4$ gas than a material of the second electrode layer.

4. The piezoelectric element according to claim 1, wherein the third electrode layer includes an outer peripheral edge surrounding the edge of the hole with a distance maintained relative to the edge of the hole when viewed in the direction perpendicular or substantially perpendicular to the second surface.

5. The piezoelectric element according to claim 1, wherein a material of the third electrode layer has a smaller rate of etching by $CF_4$ gas than a material of the single-crystal piezoelectric layer.

6. The piezoelectric element according to claim 1, wherein the hole penetrates through the second electrode layer in the direction perpendicular or substantially perpendicular to the second surface; and a connection electrode is continuously provided over a region from a position on an inner surface defining the hole in the second electrode layer to a portion of the third electrode layer facing the hole.

7. The piezoelectric element according to claim 6, wherein a minimum size of the distance is greater than an average thickness of the second electrode layer.

8. The piezoelectric element according to claim 6, wherein an average thickness of the second electrode layer is smaller than an average thickness of the third electrode layer.

9. The piezoelectric element according to claim 6, wherein a recess continuous with the hole in the second electrode layer is provided in the third electrode layer.

10. The piezoelectric element according to claim 9, wherein the connection electrode is disposed over an entire or substantially an entire inner surface of the recess.

11. The piezoelectric element according to claim 1, wherein the single-crystal piezoelectric layer is made of a lithium compound.

12. The piezoelectric element according to claim 11, wherein the lithium compound is lithium niobate or lithium tantalate.

13. The piezoelectric element according to claim 1, wherein the second electrode layer includes Pt as a main ingredient.

14. The piezoelectric element according to claim 1, wherein the first electrode layer, the second electrode layer, and the third electrode layer each include an epitaxially grown film.

15. The piezoelectric element according to claim 1, further comprising:

a base portion supporting a multilayer body including at least the first electrode layer, the single-crystal piezoelectric layer, the second electrode layer, and the third electrode layer; wherein the base portion is on one side of the multilayer body opposite to the first electrode layer and extends along a peripheral edge of the multilayer body when viewed in a lamination direction of the multilayer body.

16. The piezoelectric element according to claim 15, wherein the base portion includes a silicon oxide layer on a side closer to the multilayer body and a single-crystal silicon layer on an opposite side to the multilayer body.

17. The piezoelectric element according to claim 15, wherein a through-slit is provided in the multilayer body to communicate with a cavity inside the base portion when viewed in the lamination direction.

18. The piezoelectric element according to claim 3, wherein the third electrode layer includes an outer peripheral edge surrounding the edge of the hole with a distance maintained relative to the edge of the hole when viewed in the direction perpendicular or substantially perpendicular to the second surface.

19. The piezoelectric element according to claim 3, wherein a material of the third electrode layer has a smaller rate of etching by $CF_4$ gas than a material of the single-crystal piezoelectric layer.

20. The piezoelectric element according to claim 3, wherein the hole penetrates through the second electrode layer in the direction perpendicular or substantially perpendicular to the second surface; and a connection electrode is continuously provided over a region from a position on an inner surface defining the hole in the second electrode layer to a portion of the third electrode layer facing the hole.

* * * * *